United States Patent
Morita

[11] Patent Number: 5,974,654
[45] Date of Patent: Nov. 2, 1999

[54] PRINTED BOARD POSITIONING METHOD

[75] Inventor: Takeshi Morita, Chikushino, Japan

[73] Assignee: Matsushita Electric Industrial Co., Ltd., Osaka, Japan

[21] Appl. No.: 09/073,924

[22] Filed: May 7, 1998

[30] Foreign Application Priority Data

May 22, 1997 [JP] Japan .................................. 9-132082

[51] Int. Cl.$^6$ ............................................... B23Q 7/00
[52] U.S. Cl. ............................ 29/559; 29/760; 269/152; 269/903
[58] Field of Search ................................. 269/152, 155, 269/156, 903; 29/559, 760

[56] References Cited

U.S. PATENT DOCUMENTS

| | | |
|---|---|---|
| 3,423,502 | 1/1969 | Stimpson ............................. 29/559 X |
| 3,775,644 | 11/1973 | Cotner et al. . |
| 3,950,095 | 4/1976 | Bouygves et al. . |
| 4,405,120 | 9/1983 | Kober . |
| 4,473,455 | 9/1984 | Dean et al. . |
| 4,618,131 | 10/1986 | Campisi et al. . |
| 4,828,878 | 5/1989 | Mankut et al. . |
| 4,874,081 | 10/1989 | Kondo . |
| 4,998,712 | 3/1991 | Park et al. . |
| 5,017,865 | 5/1991 | Oldfield . |
| 5,145,055 | 9/1992 | Kondo . |
| 5,198,754 | 3/1993 | Binet . |
| 5,682,675 | 11/1997 | Hirota ...................................... 29/840 |

*Primary Examiner*—S. Thomas Hughes
*Assistant Examiner*—Steven A. Blount
*Attorney, Agent, or Firm*—Stevens, Davis, Miller & Mosher, L.L.P.

[57] ABSTRACT

There is here disclosed a printed board positioning method in which various types of printed boards different in rigidity are positioned horizontally with a good operation efficiency. Relative to a printed board laid on a first guide portion and a second guide portion, a movable clamp is advanced. The printed board is clamped from opposite sides by the movable clamp and a fixed clamp. Subsequently, after a first vertically movable clamp is lowered to press one end of the printed board onto the second guide portion, the movable clamp is retreated to release the opposite side clamping condition. Thereby, the deflection of the printed board is eliminated and the printed board is placed in a horizontal attitude. Subsequently, a second vertically movable clamp is lowered to press the other end of the printed board onto the first guide portion.

3 Claims, 2 Drawing Sheets

PRINTED BOARD POSITIONING METHOD

BACKGROUND OF THE INVENTION

1. Field of the invention

The present invention relates to a printed board positioning method in which a printed board for packaging electronic components is fixed in a predetermined operation position.

2. Description of the Related Arts

In an electronic component packaging device for mounting electronic components on a printed board, a screen printing device for applying a soldering cream on electrodes of a printed board, a bond application device for applying a bond to bond electronic components onto a printed board or the like, the printed board is positioned in a predetermined position by a positioning device in an electronic component packaging step.

In the printed board positioning device, by clamping opposite side ends of the printed board mounted on guide portions from opposite sides by movable and fixed clamps, as well as by pressing vertically movable clamps onto top surfaces of the opposite side ends of the printed board, the printed board is fixed.

Specifically, by pressing the movable clamp onto the side end face of the printed board, the printed board is clamped from the opposite sides by the movable and fixed clamps. In this case, however, if the pressing force of the movable clamp is excessively large, the printed board is deflected. On the other hand, if the pressing force is excessively small, the printed board cannot be firmly held. Thereby, a deviation or a looseness of the printed board occurs. To eliminate such disadvantages, the pressing force or clamp force of the movable clamp has to be adjusted or regulated to an optimum state. However, types of printed boards are different from one another in dimension, width and material, and have various rigidities. It is remarkably difficult to optimize the clamp force of the movable clamp for each type of the printed board. Therefore, the aforementioned disadvantages easily occur.

SUMMARY OF THE INVENTION

Wherefore, an object of the present invention is to provide a printed board positioning method in which various types of printed boards different in rigidity can be positioned in a horizontal attitude with no deflection with a satisfactory operation efficiency.

To attain this object, the present invention provides a printed board positioning method which comprises a step of advancing a movable clamp toward a side end face of a printed board on a first guide portion to clamp the printed board from opposite sides with the movable clamp and a fixed clamp on a second guide portion, opposite side ends of the printed board being laid on the first and second guide portions; a step of lowering a first vertically movable clamp to press one side end of the printed board onto the second guide portion; a step of retreating the movable clamp apart from the second guide portion to release a condition in which the printed board is clamped from the opposite sides by the movable and fixed clamps; and a step of lowering a second vertically movable clamp to press the other side end of the printed board onto the first guide portion.

According to the present invention having the aforementioned constitution, by pressing one side end of the printed board onto the second guide portion with the first vertically movable clamp, the side end is clamped by the first vertically movable clamp and the second guide portion. Subsequently, by retreating the movable clamp, the clamped condition of the printed board from opposite sides is released. At this time, the deflection of the printed board is eliminated. The printed board is set in a horizontal position. Subsequently, the second vertically movable clamp is lowered to clamp the other side end of the printed board. Therefore, the printed board can be securely clamped and fixed in the horizontal attitude.

DETAILED DESCRIPTION OF THE PREFERRED EMBODIMENTS

Figure 1:
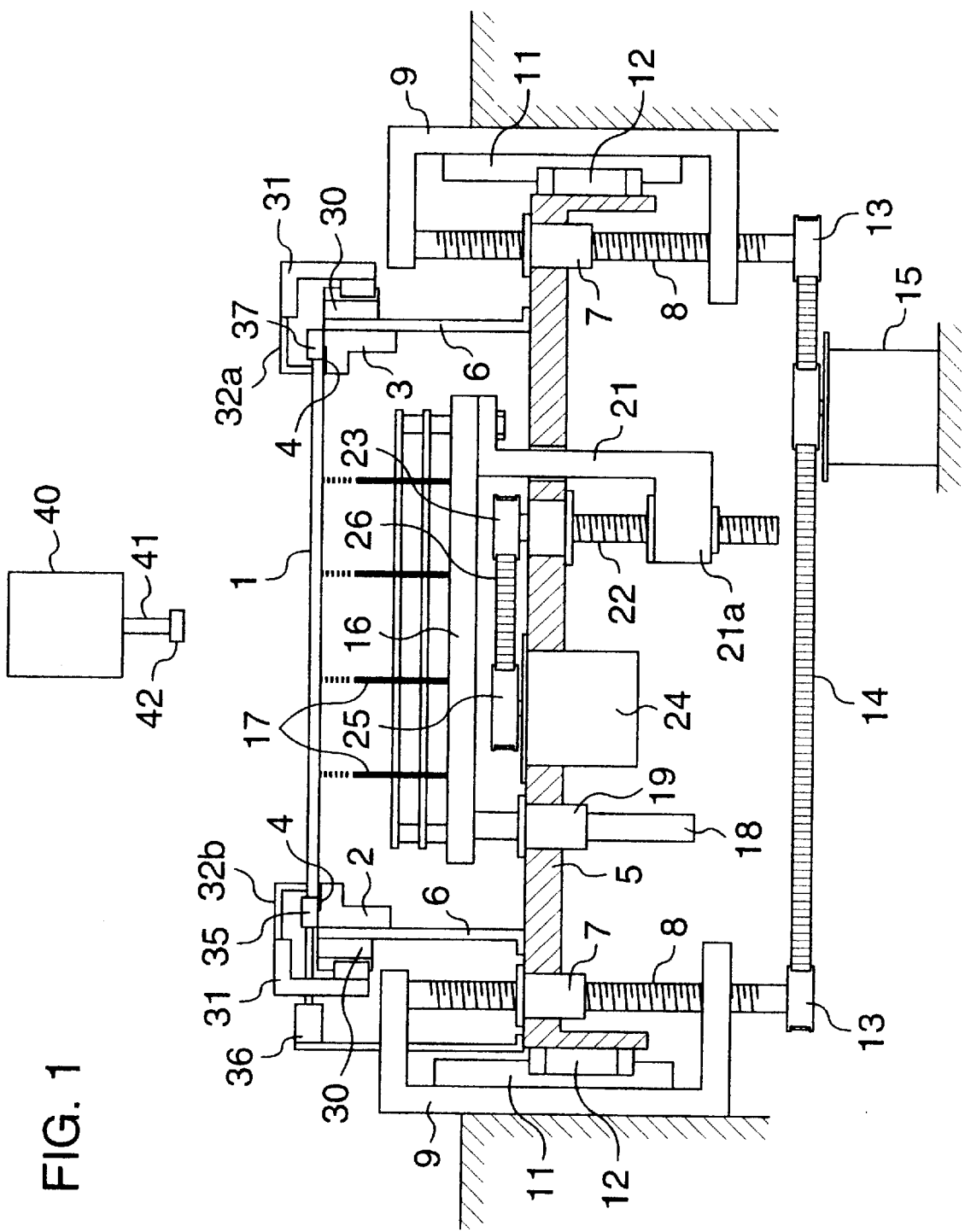
FIG. 1 is a front view of a positioning device of a printed board according to an embodiment of the present invention.

An entire structure of a printed board positioning device will be described with reference to FIG. 1. In FIG. 1, numeral 1 denotes a printed board whose opposite side ends are laid on a first guide portion 2 and a second guide portion 3. Endless conveyor belts 4 are disposed on the first guide portion 2 and the second guide portion 3, respectively. The printed board 1 is conveyed on the belts 4.

Numeral 5 denotes a base plate. The first guide portion 2 and the second guide portion 3 are attached to upper portions of brackets 6 standing upright on the base plate 5. Nuts 7 are attached to sides of the base plate 5, and feed screws 8 are engaged with the nuts 7. The feed screws 8 are beared by frames 9. Inside the frames 9 provided are guide rails 11. Sliders 12 attached to opposite side faces of the base plate 5 are slidably engaged with the guide rails 11.

Pulleys 13 are attached to lower ends of the feed screws 8. A belt 14 is disposed on the pulleys 13. When a motor 15 is operated, the belt 14 is rotated along the pulleys 13 and the feed screws 8 are also rotated. When the feed screws 8 are rotated forward or in reverse, the nuts 7 are raised or lowered along the feed screws 8. The base plate 5 is also raised or lowered.

Above the base plate 5 provided is a support plate 16. On the support plate 16, multiple bearing pins 17 stand upright for supporting the printed board 1 from below. A guide shaft 18 is vertically provided on one side of the support plate 16. The guide shaft 18 is slidably inserted in a guide ring 19 which is attached to the base plate 5.

The other side of the support plate 16 is supported by a bracket 21. The bracket 21 is inserted through the base plate 5. A vertical feed screw 22 is vertically provided on the base plate 5 and engaged with a lower nut portion 21a of the bracket 21. To an upper end of the feed screw 22 attached is a pulley 23. Numeral 24 denotes a motor attached to the base plate 5. A rotation axis of the motor 24 is provided with a pulley 25. A belt 26 is disposed on the pulleys 23 and 25.

When the motor 24 is rotated forward, the feed screw 22 is rotated and the bracket 21 is elevated. Accordingly, the support plate 16 is raised. The pins 17 are also raised until abutting on a lower face of the printed board 1 to support the printed board 1 from below (refer to the pins 17 shown by chain lines). Also, when the motor 24 is rotated in reverse, the pins 17 are lowered to release the support condition of the printed board 1.

On a rear face of each bracket 6 attached is a cylinder 30. The cylinder 30 is interconnected to racket 31. When the cylinder 30 is operated, the bracket 31 is vertically moved.

From one of the brackets 31 extended is a first vertically movable clamp 32a which is bent like a hook. Also, from the other bracket 31 similarly extended is a second vertically movable clamp 32b. The cylinders 30 serve as vertical moving means for vertically moving the first and second vertically movable clamps 32a and 32b.

On a rear face of the first guide portion 2 provided is a movable clamp 35. The movable clamp 35 is interconnected to a cylinder 36. When the cylinder 36 is operated, the movable clamp 35 is advanced or retreated in a horizontal direction in FIG. 1. Also, on a rear face of the second guide portion 3 provided is a fixed clamp 37. When the movable clamp 35 advances, the printed board 1 is clamped from opposite sides by the movable clamp 35 and the fixed clamp 37 and then fixed.

Numeral 40 denotes a transfer head which is disposed on an electronic component packaging device (not shown). The transfer head 40 has an electronic component 42 vacuum-adsorbed by a lower end of a nozzle 41. By vertically moving the transfer head 40, the electronic component 42 is mounted on the printed board 1. In the embodiment, the printed board positioning device for the electronic component packaging device has been described. The printed board positioning device of the present invention can be applied to a screen printing device, a bond application device and the like.

Figure 2A:
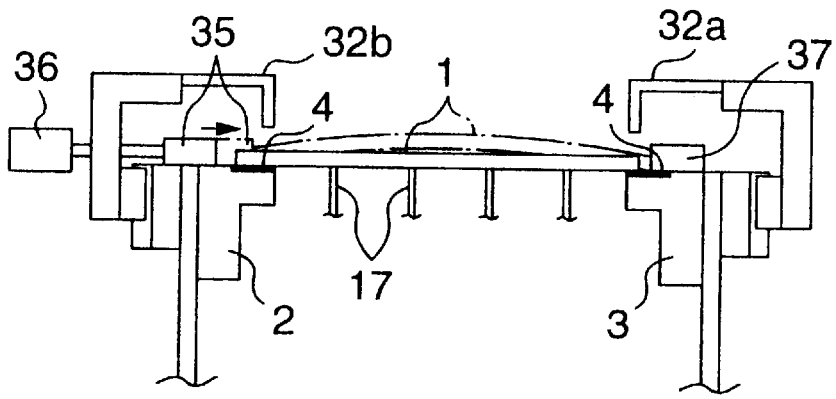
FIGS. 2A to 2D are explanatory views showing steps for positioning the printed board.

Operation of the printed board positioning device having the aforementioned constitution will be described. FIGS. 2A, 2B, 2C and 2D show in order steps for positioning the printed board 1. First, as shown in FIG. 2A, the printed board 1 is conveyed on the belts 4 and stopped between the first guide portion 2 and the second guide portion 3. At this time, the movable clamp 35 is retreated in the left as seen in the drawing. Subsequently, the cylinder 36 is operated and the movable clamp 35 advances to the right in the drawing. The printed board 1 is clamped from the right and left sides by the fixed clamp 37 and the movable clamp 35 (refer to the movable clamp 35 shown by a chain line). Since the printed board 1 is an easily deflected thin plate and the lower face thereof is supported by the pins 17, the clamped printed board 1 is deflected upward as shown by a chain line.

Figure 2B:
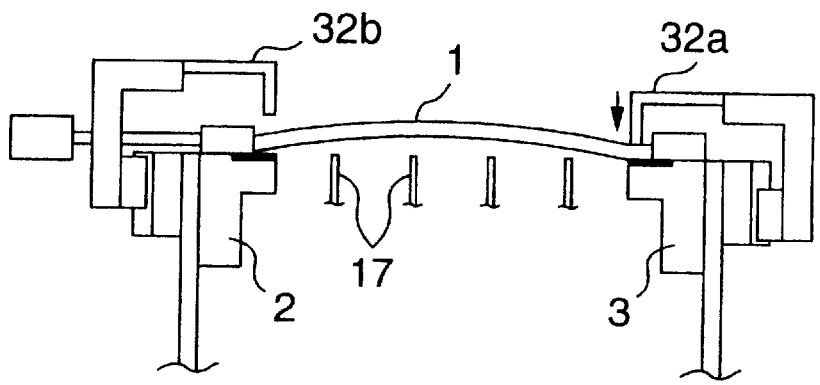
Figure 2C:
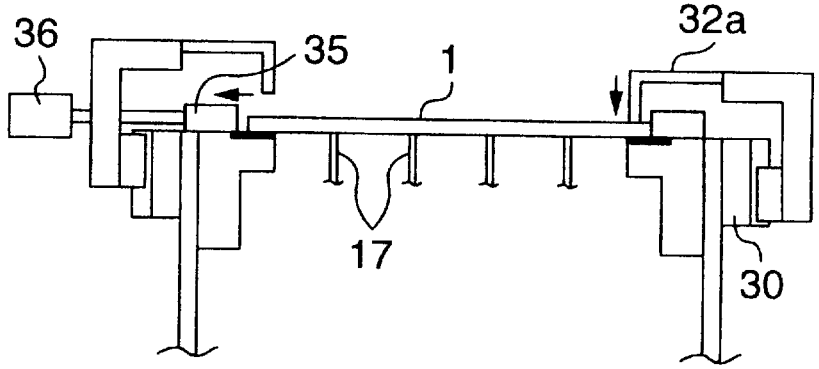
Figure 2D:
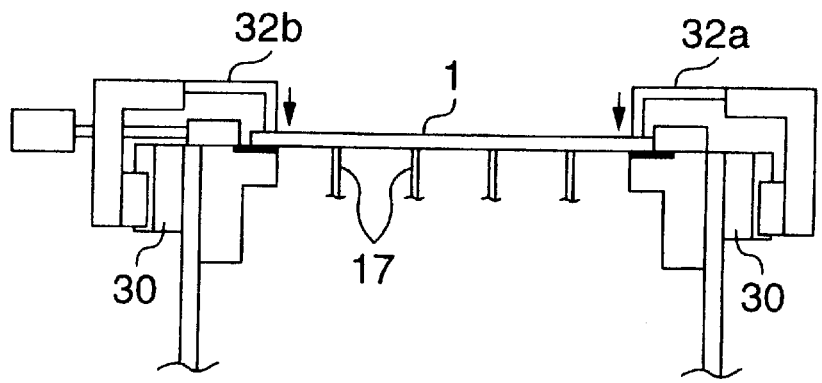

Subsequently, by operating the cylinder 30 on the side of the second guide portion 3, the first vertically movable clamp 32a is lowered to press the right end of the printed board 1 onto the second guide portion 3 (FIG. 2B). Subsequently, as shown in FIG. 2C, the movable clamp 35 retreats back to the left to release the condition of the printed board 1 clamped from the right and left sides. Then, the printed board 1 is stretched to the left because of its elasticity, as seen in the drawings. The deflection is thus corrected. The printed board 1 returns to its natural configuration or horizontal position. Subsequently, the cylinder 30 on the side of the first guide portion 2 is operated. The second vertically movable clamp 32b is then lowered to press the left end of the printed board 1 onto the first guide portion 2. In this manner, the printed board 1 is completely positioned horizontally. The transfer head 40 starts mounting the electronic component 42.

According to the present invention, the printed board can be clamped with a satisfactory operation efficiency and positioned in a horizontal attitude. Especially, the printed board varies in size, thickness and material with types. Therefore, the rigidity of the printed board is also varied. In the present invention, however, the clamping of the printed board by the movable clamp is finally released. Therefore, the clamp force of the movable clamp does not need to be adjusted. The movable clamp may just clamp the printed board with a non-adjusted pressing force. Consequently, operation and control can be remarkably easily performed.

What is claimed is:

1. A printed board positioning method which comprises:

a step of advancing a movable clamp toward a side end face of a printed board on a first guide portion to clamp the printed board from opposite sides with the movable clamp and a fixed clamp on a second guide portion, opposite side ends of the printed board being laid on the first guide portion and the second guide portion;

a step of lowering a first vertically movable clamp to press one side end of the printed board onto said second guide portion;

a step of retreating said movable clamp apart from said second guide portion to release a condition in which the printed board is clamped from the opposite sides by said movable clamp and said fixed clamp; and a step of lowering a second vertically movable clamp to press the other side end of the printed board onto said first guide portion.

2. The printed board positioning method according to claim 1 wherein by raising multiple pins until abutting on a lower face of the printed board, the printed board is supported from below.

3. The printed board positioning method according to claim 1 wherein said movable clamp clamps the printed board with a constant force irrespective of types of the printed board.

\* \* \* \* \*